United States Patent
Chang et al.

(10) Patent No.: US 9,679,745 B2
(45) Date of Patent: Jun. 13, 2017

(54) CONTROLLING AN ION BEAM IN A WIDE BEAM CURRENT OPERATION RANGE

(71) Applicant: Varian Semiconductor Equipment Associates, Inc., Gloucester, MA (US)

(72) Inventors: Shengwu Chang, South Hamilton, MA (US); Kristen Rounds, Rowley, MA (US); William Leavitt, Haverhill, MA (US); Daniel Brosnan, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/882,518

(22) Filed: Oct. 14, 2015

(65) Prior Publication Data

US 2017/0110286 A1    Apr. 20, 2017

(51) Int. Cl.
*H01J 37/30* (2006.01)
*H01J 37/317* (2006.01)

(52) U.S. Cl.
CPC ...... *H01J 37/3002* (2013.01); *H01J 37/3171* (2013.01); *H01J 2237/047* (2013.01)

(58) Field of Classification Search
None
See application file for complete search history.

(56) References Cited

U.S. PATENT DOCUMENTS

| 2008/0035856 A1* | 2/2008 | Yamashita | H01J 37/12 250/398 |
| 2009/0121149 A1* | 5/2009 | Radovanov | H01J 37/12 250/396 R |
| 2010/0025576 A1 | 2/2010 | Adams | |
| 2014/0110596 A1 | 4/2014 | Chang | |
| 2015/0144810 A1 | 5/2015 | Sinclair et al. | |
| 2015/0155129 A1 | 6/2015 | Yagita | |

FOREIGN PATENT DOCUMENTS

JP    2007220522 A    8/2007

OTHER PUBLICATIONS

International Search Report and Written Opinion mailed Jan. 12, 2017 in corresponding PCT/US2016/055125.

* cited by examiner

*Primary Examiner* — Jack Berman (57) ABSTRACT

Provided herein are approaches for controlling an ion beam within an accelerator/decelerator. In an exemplary approach, an ion implantation system includes an ion source for generating an ion beam, and a terminal suppression electrode coupled to a terminal, wherein the terminal suppression electrode is configured to conduct the ion beam through an aperture of the terminal suppression electrode and to apply a first potential to the ion beam from a first voltage supply. The system further includes a lens coupled to the terminal and disposed adjacent the terminal suppression electrode, wherein the lens is configured to conduct the ion beam through an aperture of the lens and to apply a second potential to the ion beam from a second voltage supply. In an exemplary approach, the lens is electrically insulated from the terminal suppression electrode and independently driven, thus allowing for an increased beam current operation range.

20 Claims, 7 Drawing Sheets

CONTROLLING AN ION BEAM IN A WIDE BEAM CURRENT OPERATION RANGE

FIELD OF THE DISCLOSURE

The disclosure relates generally to techniques for manufacturing electronic devices, and more particularly, to components and methods to control ion beams in beamline ion implanters.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties. For example, dopants may be introduced into an intrinsic semiconductor substrate to alter the type and level of conductivity of the substrate. In manufacturing an integrated circuit (IC), a precise doping profile provides improved IC performance. To achieve an intended doping profile, one or more dopants may be implanted in the form of ions in various doses and various energy levels.

A conventional ion implantation system may comprise an ion source and a series of beam-line components. The ion source may comprise a chamber where intended ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having intended species, shape, energy, and other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

In some applications, for example, increasing beam current to increase throughput of substrates to be implanted may be useful. Beamline ion implanters may be employed to implant substrates over a range of energies, for example, between 1 keV and 300 keV. This provides flexibility for processing substrates such as silicon wafers scheduled for various implants at differing ion energies. In order to define an implant energy, an ion beam may be subject to acceleration and/or deceleration by various components (e.g., an accelerator) in a beamline ion implanter between an ion source and substrate to be implanted.

Existing accelerators may be limited to a terminal electrode, focus electrode and ground electrode, wherein the accelerator receives the ion beam from the terminal. Except with existing accelerators, when the beam current is too high, for example, above 9 mA for a 195 keV As beam, the beam may be under-focused and thus unable to be transported through the beam-line due to beam transmission loss. Therefore, the beam current available for implanting the wafer is limited, resulting poor production throughput. On the other hand, when the beam current is too low, for example below 0.5 mA for 300 keV $B^+$ beam, the beam may become over-focused and thus unable to be transported to the wafer properly.

SUMMARY

In view of the foregoing, provided is an apparatus, system, and method for controlling an ion beam, for example, in an accelerator. In an exemplary approach, an ion implantation system includes an ion source for generating an ion beam, and a terminal suppression electrode coupled to a terminal, wherein the terminal suppression electrode is configured to conduct the ion beam through an aperture of the terminal suppression electrode and to apply a first potential to the ion beam from a first voltage supply. The system further includes a lens coupled to the terminal and disposed adjacent the terminal suppression electrode, wherein the lens is configured to conduct the ion beam through an aperture of the lens and to apply a second potential to the ion beam from a second voltage supply. In an exemplary approach, the lens is electrically insulated from the terminal and terminal suppression electrode and independently driven, thus allowing the lens to be independently driven for an increased beam current operation range. The system further includes a focus electrode configured to receive the ion beam from the lens, wherein the focus electrode is configured to apply a third potential to the ion beam, and a ground electrode assembly configured to receive the ion beam from the focus electrode.

An exemplary apparatus in accordance with the present disclosure may include a first electrode configured to conduct the ion beam through an aperture of the first electrode and to apply a first potential to the ion beam. The apparatus further includes a lens adjacent the first electrode, the lens configured to conduct the ion beam through an aperture of the lens and to apply a second potential to the ion beam, the second potential applied independently from the first potential. The apparatus further includes a second electrode configured to receive the ion beam from the lens, and a third electrode assembly configured to receive the ion beam from the second electrode.

An exemplary system in accordance with the present disclosure may include an ion source for generating an ion beam, and a terminal suppression electrode coupled to a terminal. The terminal suppression electrode may be configured to conduct the ion beam through an aperture of the terminal suppression electrode and to apply a first potential to the ion beam from a first voltage supply. The system further includes a lens coupled to the terminal and disposed adjacent the terminal suppression electrode, wherein the lens configured to conduct the ion beam through an aperture of the lens and to apply a second potential to the ion beam from a second voltage supply. The first and second potentials may each be independently controlled, and the lens may be electrically insulated from the terminal suppression electrode. The system further includes a focus electrode configured to receive the ion beam from the lens, the focus electrode configured to apply a third potential to the ion beam, an a ground electrode assembly configured to receive the ion beam from the focus electrode.

An exemplary method in accordance with the present disclosure may include applying a first potential to a first electrode to conduct the ion beam along an ion beam-line and through an aperture of a first electrode, applying a second potential to a lens to conduct the ion beam through an aperture of the lens, wherein the lens is disposed adjacent the first electrode, and wherein the first potential and the second potential are each generated by different voltage supplies. The method may further include receiving the ion beam at a second electrode, and receiving the ion beam from the second electrode at a third electrode assembly.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

A system and method in accordance with the present disclosure will now be described more fully hereinafter with reference to the accompanying drawings, where embodiments of the system and method are shown. The system and method may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, each with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

As stated above, provided herein is an apparatus, system, and method for controlling an ion beam, for example, within an accelerator of an ion implantation system. In an exemplary approach, an ion implantation system includes an ion source for generating an ion beam, and a terminal suppression electrode coupled to a terminal, wherein the terminal suppression electrode is configured to conduct the ion beam through an aperture of the terminal suppression electrode and to apply a first potential to the ion beam from a first voltage supply. The system further includes a lens coupled to the terminal and disposed adjacent the terminal suppression electrode, wherein the lens is configured to conduct the ion beam through an aperture of the lens and to apply a second potential to the ion beam from a second voltage supply.

In an exemplary approach, the lens is electrically insulated from the terminal suppression electrode and independently driven, thus allowing for an increased beam current operation range. Specifically, by separating the terminal suppression electrode from an adjustable lens, the system may increase the beam current operation range, e.g., from 0.1 mA to 25.7 mA, thus enabling a medium current ion implanter to be used for high dose (e.g., in the beam energy range 60 keV to 300 keV) applications, such as power device fabrication.

The embodiments are described herein in relation to an acceleration/deceleration column, also referred to herein as an accelerator/decelerator. The accelerator/decelerator may be an apparatus provided in a beamline ion implanter to control an ion beam intended for a substrate. The accelerator/decelerator may include a plurality of electrodes each configured to transmit the ion beam and to apply a potential to the ion beam, thus resulting in increasing or decreasing the potential (voltage) of the ion beam with respect to a reference, such as ground. The accelerator/decelerator may thus function to accelerate or decelerate an ion beam after the ion beam is extracted from an ion source to a target energy, such as an intended implant energy. The accelerator/decelerator may also function to provide an intended beam optics over a range of ion energies and beam currents of an ion beam. Thus, the accelerator/decelerator may operate to output an ion beam having an intended shape, size, collimation, convergence or divergence, each remaining within an acceptable range. The accelerator/decelerator further includes an adjustable lens, described in greater detail below.

Figure 1:
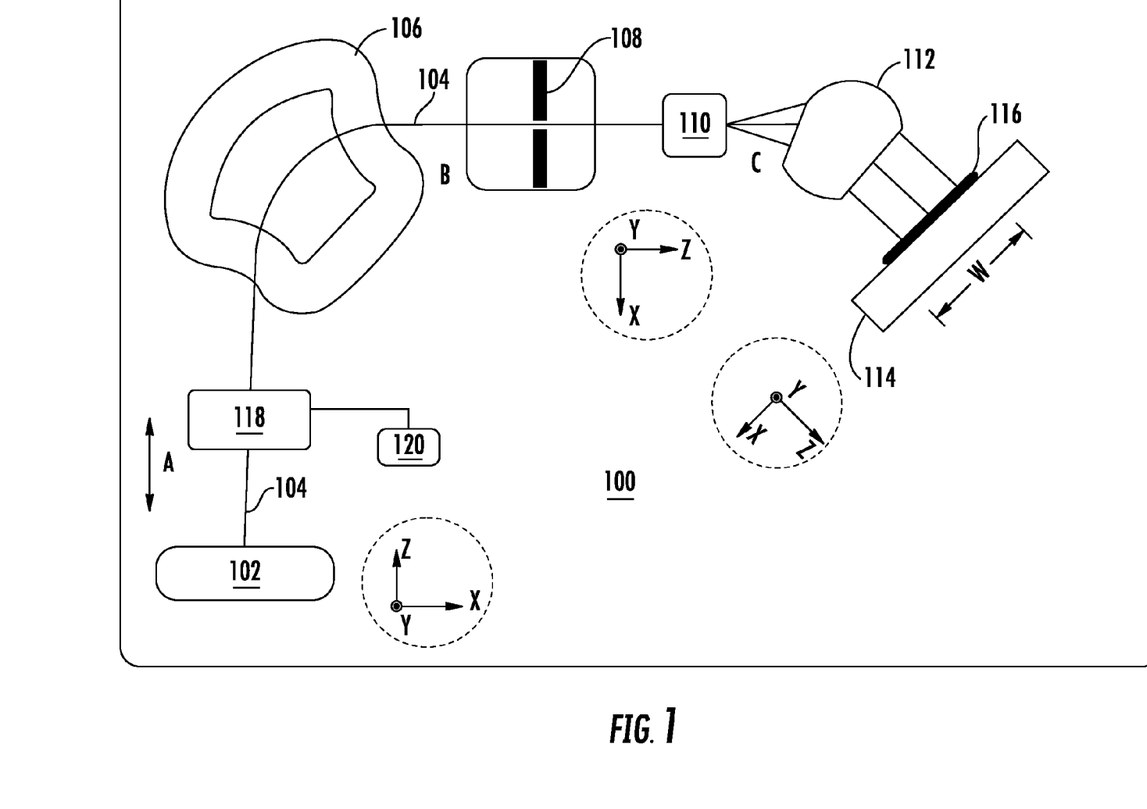
FIG. 1 is a schematic view illustrating an ion implantation system in accordance with the present disclosure.

FIG. 1 depicts a top plan view in block form of a beamline ion implanter, shown as the ion implanter 100, in accordance with various embodiments of the disclosure. The ion implanter 100 includes an ion source 102 configured to generate an ion beam 104. The ion beam 104 may be provided as a spot beam or a ribbon beam having a cross-section with a beam width (along the X-direction of the Cartesian coordinate shown) greater than the beam height (along the Y-direction). In the convention used herein, the Z-direction refers to a direction of an axis parallel to the central ray trajectory of an ion beam 104. Thus, the absolute direction of the Z-direction, as well as the X-direction (perpendicular to the Z-direction), may vary at different points within the ion implanter 100, as shown.

The ion source 102 may include an ion chamber where a feed gas supplied to the ion chamber is ionized. This gas may be or may include or contain hydrogen, helium, other rare gases, oxygen, nitrogen, arsenic, boron, phosphorus, aluminum, indium antimony, carborane, alkanes, another large molecular compound, or other p-type or n-type dopants. The generated ions may be extracted from the ion chamber by a series of extraction electrodes (not shown) to form the ion beam 104. The ion beam 104 may travel through an analyzer magnet 106, mass resolving slit 108, and through a collimator 112 before impacting a substrate 116 disposed on substrate stage 114. The substrate stage 114 may be configured to scan the substrate 116 at least along the Y-direction in some embodiments.

In the example shown in FIG. 1, the ion beam 104 may be provided as a spot beam scanned by the scanner 110 along the X-direction, in order to provide a scanned ion beam having a width comparable to the width W of the substrate 116. In other embodiments, the ion beam 104 may be provided as a ribbon beam. In the example of FIG. 1, other beamline components useful for operation of the ion implanter 100 are omitted for clarity, as will be apparent to those of ordinary skill in the art.

The ion implanter 100 further includes an accelerator/decelerator 118. As shown in FIG. 1, the accelerator/decelerator 118 may be disposed at a point A between the ion source 102 and analyzer magnet 106. In other embodiments, the accelerator/decelerator 118 may be disposed at other locations within the ion implanter 100, such as point B or point C. The accelerator/decelerator 118 may be coupled to a drive system 120 operable to adjust the position of an electrode within the accelerator/decelerator 118 with respect to other electrode(s). This allows, among other things, the beam current in the ion beam 104 to be adjusted at a given ion energy of the ion beam 104.

In various embodiments, the ion implanter 100 may be configured to deliver ion beams for "medium" energy ion implantation, or a voltage range of 60 kV to 300 kV, corresponding to an implant energy range of 60 keV to 300 keV for singly charged ions. As discussed below, a lens of the accelerator/decelerator 118 is electrically insulated from a terminal suppression electrode and independently driven, thus allowing for an increased beam current operation range of the ion implanter 100.

Figure 2:
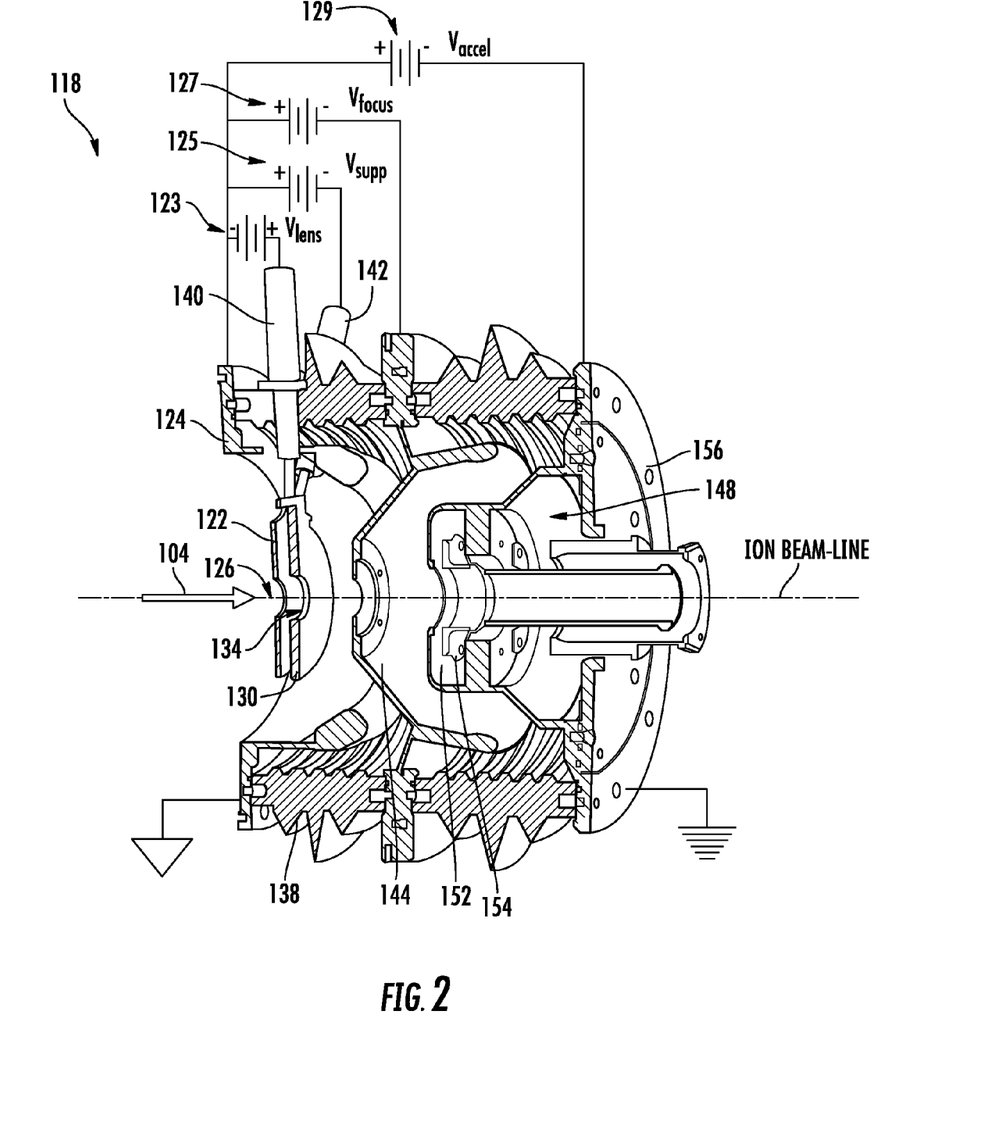
FIG. 2 is a side cross-sectional view illustrating an accelerator of the ion implantation system shown in FIG. 1 in accordance with the present disclosure.
Figure 3:
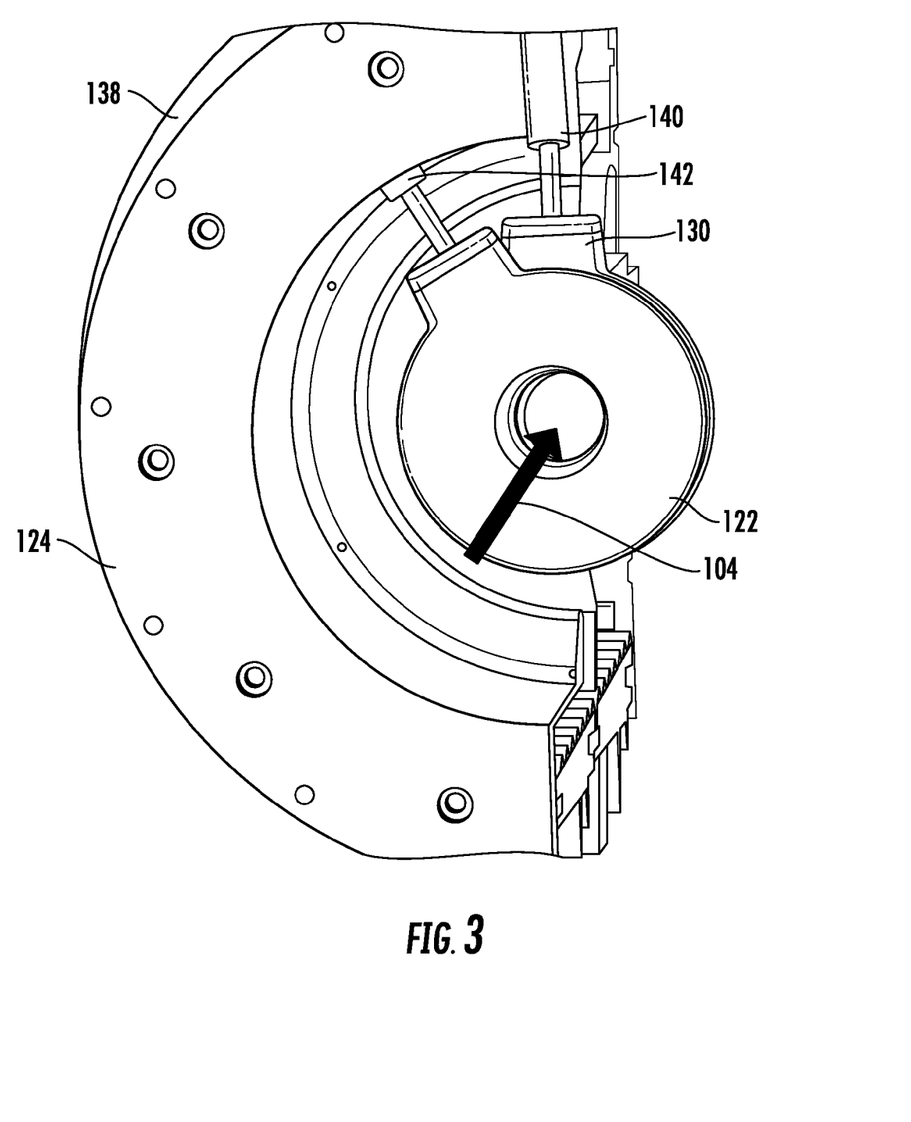
FIG. 3 is a front cross-sectional view illustrating the accelerator of the ion implantation system shown in FIG. 1 in accordance with the present disclosure.

FIGS. 2-3 depict side and front views, respectively of the accelerator/decelerator 118 according to various embodiments. In one embodiment, the accelerator/decelerator 118 includes a terminal 124 housing a first electrode 122 and a lens 130 disposed adjacent to the first electrode 122, the terminal 124 configured to receive the ion beam 104 from the ion source 102 (FIG. 1). In one embodiment, the first electrode 122 may be a terminal suppression electrode coupled to the terminal 124 and configured to conduct the ion beam 104 through an aperture 126 formed therein. The first electrode 122 is configured to apply a first electrode potential ($V_{supp}$) to the ion beam 104 from a first voltage supply 123 to communicate the ion beam 104 along an ion beam-line to the lens 130, positioned adjacent/downstream of the first electrode 122. The lens 130 is also coupled to the terminal 124, and is configured to conduct the ion beam 104 through an aperture 134 of the lens 130 and to apply a second potential ($V_{lens}$) to the ion beam 104 from a second voltage supply 125.

As shown, the accelerator/decelerator 118 further includes an insulator 138 including a first connector 140 and a second connector 142 each extending through the terminal 124. The first connector 140 is coupled to the first electrode 122 and to the first voltage supply (Vsupp), and the second connector 142 is coupled to the lens and to the second voltage supply (Vlens), thus enabling the lens 130 to be electrically insulated from the terminal 124 and the first electrode 122 to allow independent control of the first and second potentials. In one embodiment, first and second connectors 140, 142 extend into an interior cavity of the accelerator/decelerator 118 through a set of apertures formed through the terminal.

The accelerator/decelerator 118 further includes a second electrode 144, such as a focus electrode, configured to receive the ion beam 104 from the lens 130, wherein the second electrode 144 is configured to apply a third potential ($V_{focus}$) from a third voltage supply 127. The second electrode 144 may supply the ion beam 104 to a third electrode assembly 148, such as a ground electrode assembly. In one embodiment, the third electrode assembly 148 includes a ground electrode 152 having an aperture formed therein, a ground suppression electrode 154, and a ground component 156. The Third electrode assembly further includes a coupler 158 for securing the accelerator/decelerator 118 to adjacent components within the ion implanter 100. Together, the ground electrode 152, the ground suppression electrode 154, and the ground component 156 are configured to apply a fourth potential ($V_{accel}$) to the ion beam 104 from a fourth voltage supply 129.

In one example of operation of the accelerator/decelerator 118, the ion beam 104 may be extracted from the ion source 102 (FIG. 1) using an extraction electrode (not shown) at a target extraction voltage, such as 50 kV. This may provide an adequate extracted beam current for the ion beam 104 immediately adjacent the ion source 102 in order to deliver a target beam current or beam dose to the substrate 116 (FIG. 1). The accelerator/decelerator 118 may adjust the initial beam potential of ion beam 104 generated by the extraction electrode by changing the voltage (potential) of the extracted ion beam in order to impart an intended energy to the ion beam 104 for implantation.

Figure 4:
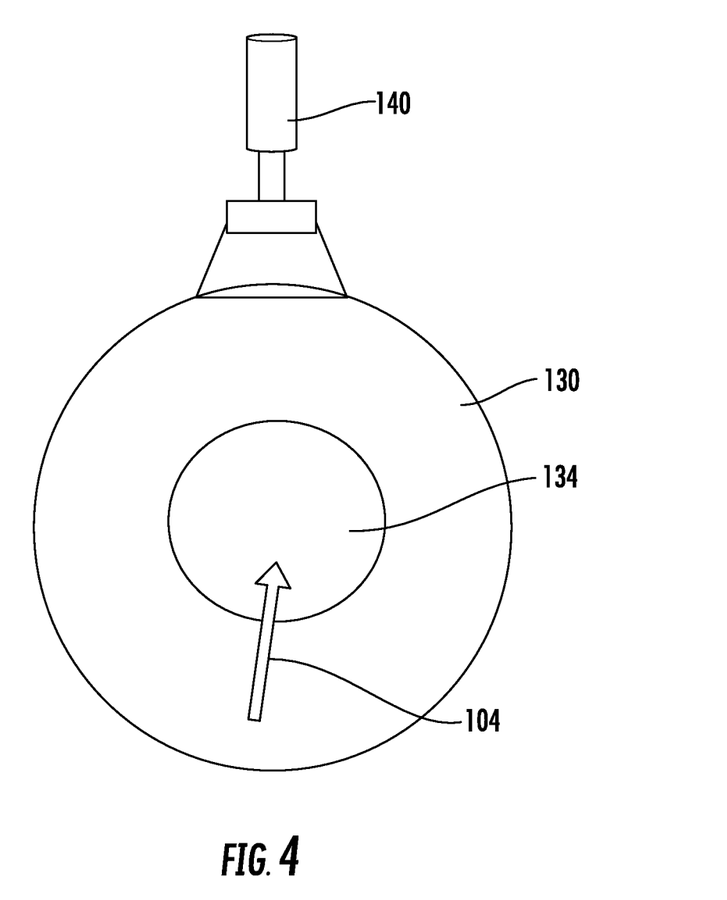
FIG. 4 is a front view of a lens of the accelerator shown in FIG. 1 in accordance with the present disclosure.

Referring now to FIGS. 3-4, an exemplary lens will be described in greater detail. In one embodiment, the lens 130 is a terminal lens for providing a beam such as the ion beam 104 beam from the ion source 102 (FIG. 1). The term "terminal" is used to refer to a last lens exposing the ion beam 104. The ion beam 104 generally does not originate at the terminal lens 130 and is instead outputted from the terminal lens 130 and passed to another device or component, such as the second electrode 144. For example, although the exact operation of the lens 130 can vary, the lens 130 is generally operative to expose the ion beam 104 to an electric field and/or a magnetic field, to select or direct intended species through the lens 130 and onto the second electrode 144. The ion beam 104 emitted therefrom may be focused, rendered parallel, or otherwise outputted in a particular manner. In one embodiment, the lens 130 is held at a certain voltage ($V_{lens}$) during the time an ion or electron in the ion beam 104 traverses the aperture 134. In other embodiments the lens 130 can operate in conjunction with one or more additional lenses and other components of the ion implanter 100 to provide an intended output from accelerator/decelerator 118.

In one embodiment, the potential ($V_{lens}$) of the terminal lens 130 may be set in a range of −50 kV to +50 kV relative to the terminal 124 by high voltage power supply 123. For example, when the potential of the lens 130 is positive relative to the terminal 124 and the first electrode 122, the ion beam 104 is decelerated from the first electrode 122 to the lens 130 first, and then is accelerated from the lens 130 to the second electrode 144. As a result, the focusing power of the accelerator/decelerator 118 is beneficially increased.

Figure 5A:
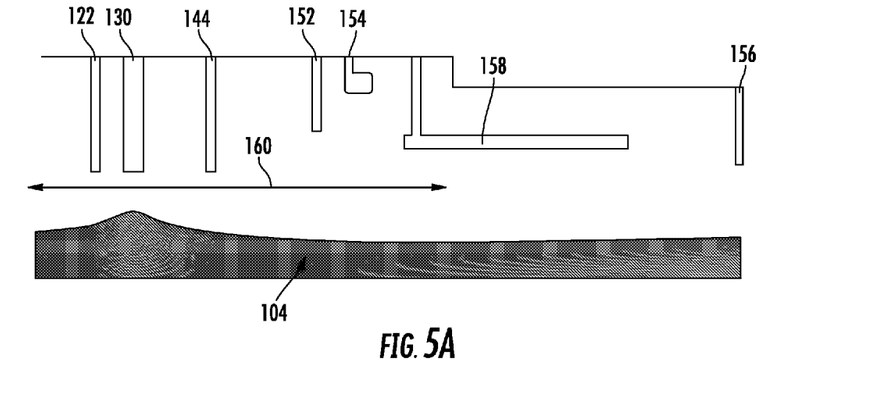
FIGS. 5A-B are side cross sectional views illustrating the accelerator and an ion beam shown in FIG. 1 in accordance with the present disclosure.

In one embodiment, as shown in FIG. 5A, when the lens voltage ($V_{lens}$) is set to +32 kV (relative to the terminal 124), the focus voltage ($V_{focus}$) to the second electrode 144 is set to −125 kV (relative to the terminal 124), and the suppression voltage (Vsupp) to the first electrode 122 is set to −2.4 kV (relative to the terminal 124), accelerator/decelerator 118 may accelerate a 25.7 mA As+ beam from 70 keV to 195 keV. The ion beam 104 is thus generated parallel, or approximately parallel, to a lengthwise axis 160 of the accelerator/decelerator 118 when the ion beam 104 exits the accelerator/decelerator 118, for example as shown by the simulated ion beam 104.

Figure 5B:
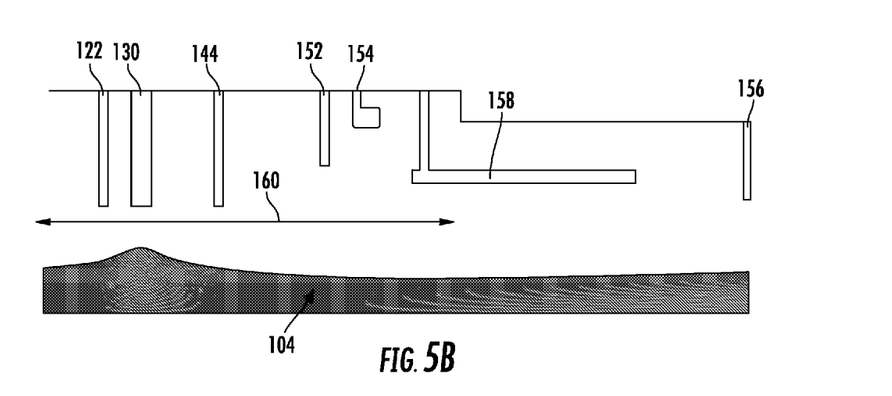

In another example, when the potential of the terminal lens 130 is negative relative to the terminal 124 and the first electrode 122, the ion beam 104 is accelerated from the first electrode 122 to the lens 130 first, and then is accelerated again from the lens 130 to the second electrode (e.g., focus electrode) 144. As a result, the focusing power of the accelerator/decelerator 118 is reduced significantly. In one embodiment, as shown in FIG. 5B, when the lens voltage (Vlens) to the lens 130 is set to −7 kV, the focus voltage (Vfocus) to the second electrode 144 is set to −70 kV, and the suppression voltage (Vsupp) to the first electrode 122 is set to −7 kV (relative to the terminal 124), accelerator 188 is configured to accelerate a 0.5 mA B+ beam from 80 keV to 300 keV, while allowing the ion beam 104 to be parallel, or approximately parallel, to the lengthwise axis 160 when exiting the accelerator/decelerator 118, as shown by the simulated ion beam 104. As a result, the accelerator/decelerator 118 has significantly wider beam current operation range, e.g., from approximately 0.1 mA to 25.7 mA.

Figure 6:
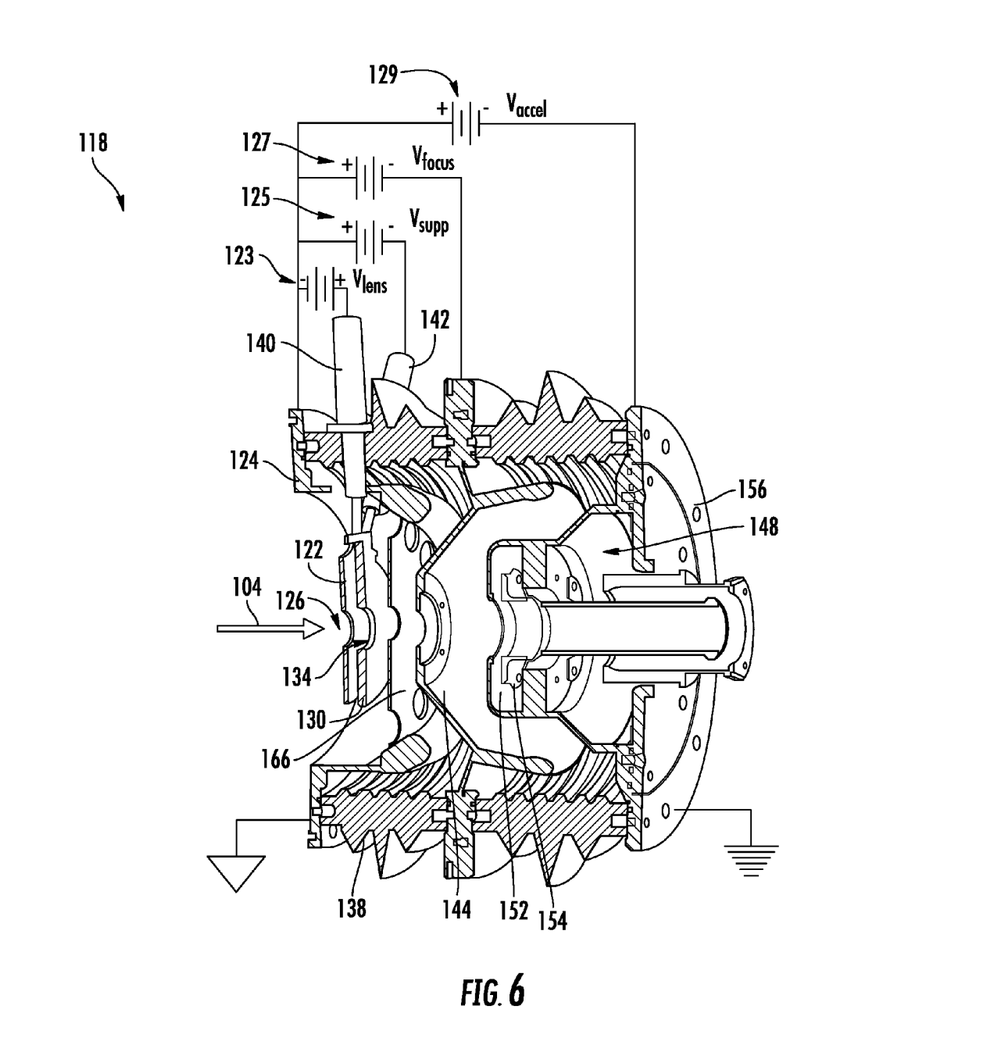
FIG. 6 is a side cross-sectional view illustrating another embodiment of the accelerator of the ion implantation system shown in FIG. 1 in accordance with the present disclosure.

In various additional embodiments, an accelerator may include additional components to those illustrated in FIG. 2. For example, FIG. 6 illustrates the accelerator/decelerator 118 including a fourth electrode (e.g., a terminal electrode) 166 disposed between the lens 130 and the second electrode 144. The fourth electrode 166 may provide protection to the focus power supply 127 (i.e., the third voltage supply) and the first voltage supply 123 by preventing cross-communication therebetween. The accelerator/decelerator 118 shown in FIG. 6 similarly includes the first electrode 122, the lens 130, and the insulator 138, including a first and second connectors 140, 142 extending through the terminal 124. The first connector 140 is coupled to the first electrode 122 and to the first voltage supply 123, and the second connector 142 is coupled to the lens 130 and to the second voltage supply 125 so the lens 130 is electrically insulated from the terminal 124 and the first electrode 122 so as to allow independent control of the first and second potentials, $V_{supp}$ and $V_{lens}$.

Figure 7:
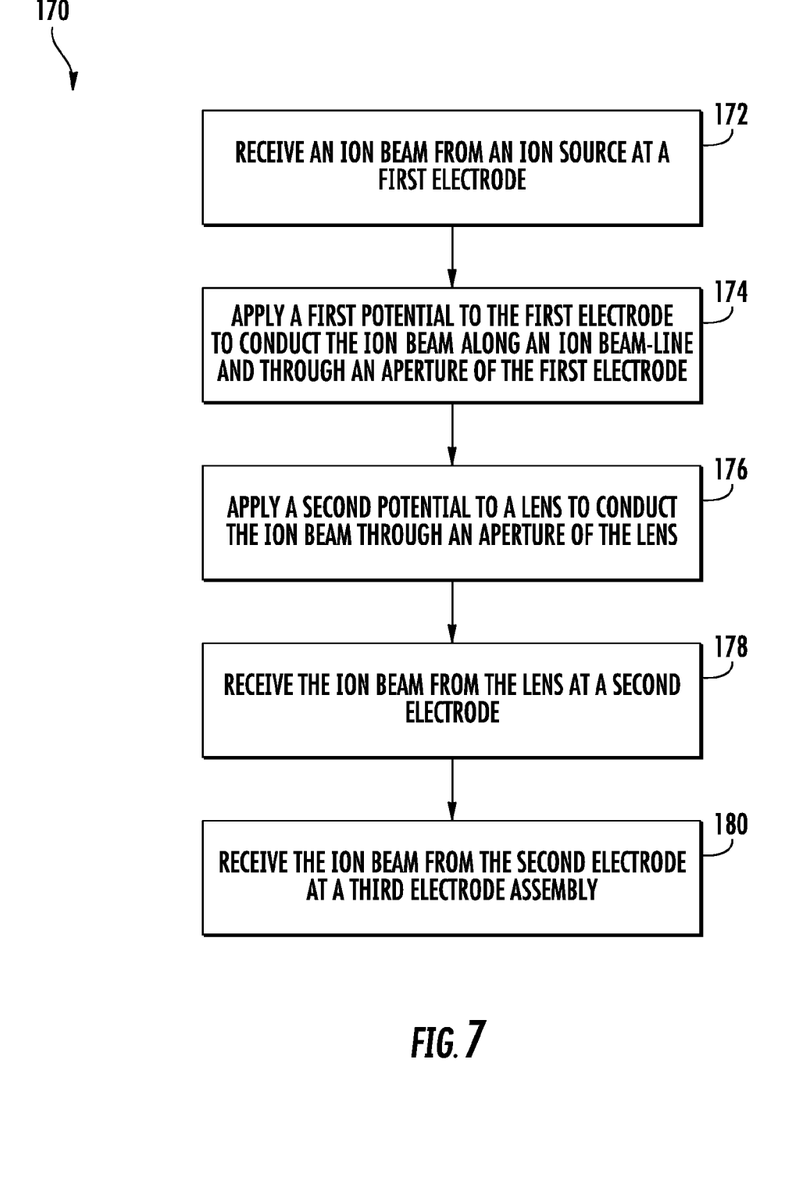
FIG. 7 is a flowchart illustrating an exemplary method according to the present disclosure.

Referring now to FIG. 7, a flow diagram illustrating an exemplary method 170 for controlling an ion beam in accordance with additional embodiments of the present disclosure is shown. The method 170 will be described in conjunction with the representations shown in FIGS. 1-6.

Method 170 includes receiving an ion beam from an ion source at a first electrode, as shown in block 172. In some embodiments, the ion source is proved as part of an ion implanter.

Method 170 further includes applying a first potential to the first electrode to conduct the ion beam along an ion beam-line and through an aperture of the first electrode, as shown in block 174. In some embodiments, the first electrode is a terminal suppression electrode.

Method 170 further includes applying a second potential to a lens to conduct the ion beam through an aperture of the lens, as shown in block 176. In one embodiment, the lens is disposed adjacent the first electrode, wherein the first potential and the second potential are each generated by different voltage supplies. In one embodiment, the first electrode is coupled to a first voltage supply via a first connector extending through an insulator, and the lens is coupled to a second voltage supply via a second connector extending through the insulator, wherein the insulator electrically insulates the first electrode from the lens.

Method 170 further includes receiving the ion beam from the lens at a second electrode, as shown in block 178. In one embodiment, the second electrode is a focus electrode. In one embodiment, a third potential is applied to the second electrode to conduct the ion beam through an aperture of the second electrode.

Method 170 further includes receiving the ion beam from the second electrode at a third electrode assembly, as shown in block 180. In one embodiment, the third electrode assembly includes a ground electrode, a ground suppression electrode, and a ground. In one embodiment, a fourth potential is applied to the third electrode assembly to conduct the ion beam through the third electrode assembly.

In view of the foregoing, at least the following advantages are achieved by the embodiments disclosed herein. Firstly, a configuration is provided to accelerate an ion beam in a wide beam current operation, thus resulting in improved production throughput. Specifically, by providing a terminal lens disposed between a terminal suppression electrode and a focusing electrode, and providing an independent power supply to the lens, production capabilities of a medium current ion implanter may be extended to the manufacture of power devices having a current operation range of approximately 0.1 mA to 25 mA in an energy range of approximately 60 kV to 300 keV. This is an improvement over prior art accelerators having a relatively narrow beam current operation range of 1 mA to 9 mA.

Secondly, the medium current ion implanter may be extended to the manufacture of power devices, yet with minimal component changes to the overall structure of the ion implanter, thus reducing cost and improving or maintaining throughput.

Thirdly, unlike a prior art ion beam accelerator/decelerator having three (3) electrodes, namely, a terminal electrode, a focus electrode, and a ground electrode, wherein just the voltage on the focus electrode is adjustable, embodiments herein advantageously provide an accelerator/decelerator having five (5) electrodes. Specifically, the accelerator/decelerator of the present embodiments includes a terminal electrode, a lens suppression electrode, a lens, a focus electrode, and a ground electrode, thus allowing for three (3) voltages (e.g., voltage on lens suppression electrode, voltage on lens, and voltage on focus electrode). Each of these voltages is independently adjustable, thus enabling the ion beam accelerator/decelerator to have greater control on the beam optics.

Based on the foregoing, persons skilled in the art will recognize the disclosure is susceptible of broad utility and application. Many embodiments and adaptations of the disclosure other than those specifically described herein, as well as many variations, modifications, and equivalent arrangements, will be apparent from or reasonably suggested by the present disclosure and the foregoing descriptions thereof. Accordingly, while the disclosure has been described herein in detail in relation to exemplary embodiments, persons skilled in the art will understand the disclosure is illustrative and exemplary of the present disclosure and is made merely for the purpose of providing a full and enabling disclosure of the disclosure. The foregoing disclosure is not intended to be construed to limit the disclosure or otherwise preclude any such other embodiments, adaptations, variations, modifications or equivalent arrangements; the disclosure being limited just by the claims appended hereto and the equivalents thereof. Although specific terms are employed herein, terms may be are used in a generic and descriptive sense just and not for the purpose of limitation.

The invention claimed is:

1. An accelerator/decelerator to control an ion beam, the accelerator/decelerator comprising:

a first electrode coupled to a terminal, the first electrode configured to conduct the ion beam through an aperture of the first electrode and to apply a first potential to the ion beam from a first voltage supply;

a lens adjacent the first electrode, the lens coupled to the terminal and electrically insulated from the first electrode, wherein the lens is configured to conduct the ion beam through an aperture of the lens and to apply a second potential to the ion beam from a second voltage supply, the second potential applied independently from the first potential;

a second electrode configured to receive the ion beam from the lens; and a third electrode assembly configured to receive the ion beam from the second electrode.

2. The accelerator/decelerator of claim 1, further comprising a fourth electrode disposed between the lens and the second electrode.

3. The accelerator/decelerator of claim 2, wherein the fourth electrode is a terminal electrode.

4. The accelerator/decelerator of claim 1, further comprising:

the terminal housing the first electrode and the lens, the terminal receiving the ion beam from an ion source; and an insulator including a first connector and a second connector each extending through the terminal, wherein the first connector is coupled to the first electrode and to the first voltage supply, and wherein the second connector is coupled to the lens and to the second voltage supply.

5. The accelerator/decelerator of claim 4, wherein the insulator electrically insulates the first electrode from the lens.

6. The accelerator/decelerator of claim 1, wherein the first electrode is a terminal suppression electrode, and wherein the second electrode is a focus electrode configured to apply a third potential to the ion beam.

7. The accelerator/decelerator of claim 1, the third electrode assembly comprising:

a ground electrode;

a ground suppression electrode; and a ground component, wherein the ground electrode, the ground suppression electrode and the ground component are configured to apply a fourth potential to the ion beam.

8. The accelerator/decelerator of claim 1, wherein the first electrode, the lens, the second electrode, and the third electrode assembly are configured to accelerate the ion beam along an ion beam-line at a current operation range of approximately 0.1 mA to 25.7 mA.

9. The accelerator/decelerator of claim 8, wherein the first electrode, the lens, the second electrode, and the third electrode are configured to accelerate the ion beam from a potential of approximately 60 keV to a potential of approximately 300 keV.

10. An ion implantation system, comprising:

an ion source for generating an ion beam; and an accelerator/decelerator comprising:

a terminal suppression electrode coupled to a terminal, the terminal suppression electrode configured to conduct the ion beam through an aperture of the terminal suppression electrode and to apply a first potential to the ion beam from a first voltage supply;

a lens coupled to the terminal and disposed adjacent the terminal suppression electrode, wherein the lens is configured to conduct the ion beam through an aperture of the lens and to apply a second potential to the ion beam from a second voltage supply, the first and second potentials independently controlled, and wherein the lens is electrically insulated from the terminal suppression electrode; and a focus electrode configured to receive the ion beam from the lens, the focus electrode configured to apply a third potential to the ion beam; and a ground electrode assembly configured to receive the ion beam from the focus electrode.

11. The ion implantation system of claim 10, further comprising a terminal electrode disposed between the lens and the focus electrode.

12. The ion implantation system of claim 10, further comprising an insulator including a first connector and a second connector each extending through the terminal, wherein the first connector is coupled to the terminal suppression electrode and to the first voltage supply, and wherein the second connector is coupled to the lens and to the second voltage supply.

13. The ion implantation system of claim 10, wherein the terminal suppression electrode, the lens, the focus electrode, and the ground electrode assembly are arranged as an accelerator configured to accelerate the ion beam from a potential of 60 keV to a potential of 300 keV.

14. A method for controlling an ion beam in an accelerator/decelerator, the method comprising:

applying a first potential from a first voltage supply to a first electrode to conduct the ion beam along an ion beam-line and through an aperture of a first electrode, the first electrode coupled to a terminal;

applying a second potential from a second voltage supply to a lens to conduct the ion beam through an aperture of the lens, wherein the lens is coupled to the terminal and is disposed adjacent the first electrode, and wherein the lens is electrically insulated from the first electrode;

receiving the ion beam at a second electrode; and receiving the ion beam from the second electrode at a third electrode assembly.

15. The method of claim 14, further comprising applying a third potential to the second electrode to conduct the ion beam through the second electrode.

16. The method of claim 14, further comprising applying a fourth potential to the third electrode assembly to conduct the ion beam through the third electrode assembly.

17. The method of claim 14, further comprising providing a fourth electrode disposed along the ion beam-line between the lens and the second electrode.

18. The method of claim 14, further comprising:

coupling the first electrode to the first voltage supply via a first connector of an insulator, the first connector extending through the terminal; and coupling the lens to the second voltage supply via a second connector of the insulator, the second connector extending through the terminal, wherein the insulator electrically insulates the first electrode from the lens.

19. The method of claim 14, further comprising arranging the first electrode, the lens, the second electrode, and the third electrode assembly along the ion beam-line.

20. The method of claim 19, further comprising accelerating the ion beam from a potential of 60 keV to a potential of 300 keV.

* * * * *